United States Patent
Copeland et al.

(10) Patent No.: US 6,555,912 B1
(45) Date of Patent: Apr. 29, 2003

(54) CORROSION-RESISTANT ELECTRODE STRUCTURE FOR INTEGRATED CIRCUIT DECOUPLING CAPACITORS

(75) Inventors: Bruce A. Copeland, Wappingers Falls, NY (US); Rebecca Yung Gorrell, Lagrangeville, NY (US); Donald W. Scheider, Poughquag, NY (US); Mark A. Takacs, Poughkeepsie, NY (US); Kenneth J. Travis, Jr., Newburgh, NY (US); Peter O. Ulanmo, Hopewell Junction, NY (US); Jun Wang, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/047,475

(22) Filed: Oct. 23, 2001

(51) Int. Cl.$^7$ .......................... H01L 23/48; H01L 23/52; H01L 29/40
(52) U.S. Cl. .................. 257/766; 257/750; 257/780; 257/781
(58) Field of Search .................... 257/734–737, 257/738, 779, 780, 781, 782, 783, 784, 750–753, 762, 758, 766; 438/613, 652–654, 612–617

(56) References Cited

U.S. PATENT DOCUMENTS

| | | | |
|---|---|---|---|
| 4,439,813 A | 3/1984 | Dougherty et al. | 361/321 |
| 5,175,609 A | 12/1992 | DiGiacomo et al. | 257/766 |
| 5,266,522 A | 11/1993 | DiGiacomo et al. | 437/192 |
| 5,471,092 A | * 11/1995 | Chan et al. | 257/753 |
| 5,903,058 A | * 5/1999 | Akram | 257/778 |
| 6,043,973 A | 3/2000 | Nagashima et al. | 361/305 |
| 6,071,800 A | 6/2000 | Shigemoto et al. | 438/612 |
| 6,121,127 A | 9/2000 | Shibata et al. | 438/604 |
| 6,121,688 A | * 9/2000 | Akagawa | 257/778 |
| 6,222,246 B1 | 4/2001 | Mak et al. | 257/532 |
| 6,222,260 B1 | 4/2001 | Liang et al. | 257/691 |
| 6,235,412 B1 | 5/2001 | Cheng et al. | 42/670 |

\* cited by examiner

*Primary Examiner*—Cuong Quang Nguyen
(74) *Attorney, Agent, or Firm*—James Cioffi; Cantor Colburn LLP

(57) ABSTRACT

A corrosion resistant electrode structure for interconnecting a decoupling capacitor to a substrate is disclosed. In an exemplary embodiment of the invention, the electrode structure includes a first chromium layer formed upon the capacitor and a first nickel layer formed upon the first chromium layer. A noble metal conductive layer is then formed upon the first nickel layer and a second nickel layer is formed upon said noble metal conductive layer. The second nickel layer has a thickness which is greater than a thickness of the first nickel layer. A second chromium layer is then formed upon the nickel layer.

12 Claims, 2 Drawing Sheets

CORROSION-RESISTANT ELECTRODE STRUCTURE FOR INTEGRATED CIRCUIT DECOUPLING CAPACITORS

BACKGROUND

The present invention relates generally to integrated circuit devices and, more particularly, to a corrosion-resistant electrode structure for integrated circuit decoupling capacitors used in non-hermetic environments.

As ultra large-scale integrated (ULSI) circuits have continued to evolve, they have become more complex with respect to switching more and more output driver circuits at higher and higher speeds. In addition, an increase in the use of parallel processing has resulted in the design of integrated circuits with a high number of driver circuits to switch simultaneously at fast transition speeds and high currents. Since the effective inductance of semiconductor chips for these active switching circuits is directly related to the amount of power distribution noise, the driver circuit power connections are particularly sensitive to the noise created by the effective inductance inherent in simultaneous switching activity.

This effective inductance can be lowered by connecting decoupling capacitors in proximity to an integrated circuit (IC). Since inductance is a function of current path length, the shorter the current path, the lower the inductance. High inductance, which yields higher supply noise in semiconductor packages, reduces the performance of ICs. Decoupling capacitors placed close to power consuming circuits are able to smooth out voltage variation with a stored charge thereon. The stored charge may be dissipated, or may also be used as a local power supply to device inputs during signal switching stages, thereby allowing the decoupling capacitor to negate the effects of voltage noise induced into the system by parasitic inductance.

Decoupling capacitors have been provided as discrete components on integrated circuit chip carriers (i.e., modules which carry either single or multiple IC chips). Such decoupling capacitors provided "off chip" are typically mounted upon a packaging substrate by means of solder ball pads (also known in the art as C4 technology) formed upon the electrode interconnect metallurgy of the capacitor body. Typically, this interconnect metallurgy includes a copper layer to provide sufficient electrical conductivity between the capacitor and the substrate. Although copper is a suitable conductive metal for a decoupling capacitor electrode structure in a hermetic environment, there are also applications in which IC modules are operated in non-hermetic environments. In this case, the metallurgy (i.e., copper) of a conventional electrode structure is subject to corrosive effects and, accordingly, structural weakening of the interconnection between the capacitor and the substrate.

BRIEF SUMMARY

The above discussed and other drawbacks and deficiencies of the prior art are overcome or alleviated by an electrode structure for interconnecting a decoupling capacitor to a substrate. In an exemplary embodiment of the invention, the electrode structure includes a first chromium layer formed upon the capacitor and a first nickel layer formed upon the first chromium layer. A noble metal conductive layer is then formed upon the first nickel layer and a second nickel layer is formed upon said noble metal conductive layer. The second nickel layer has a thickness which is greater than a thickness of the first nickel layer. A second chromium layer is then formed upon the nickel layer.

In a preferred embodiment, the noble metal conductive layer is a gold layer which is about 2,500 Å in thickness. The first and second chromium layers are each about 1,500 Å in thickness. The first nickel layer is about 1,000 Å in thickness, and the second nickel layer is at least 5,000 Å in thickness, and preferably is about 6,000 Å in thickness.

BRIEF DESCRIPTION OF THE DRAWINGS

Referring to the exemplary drawings wherein like elements are numbered alike in the several Figures.

DETAILED DESCRIPTION

Figure 1:
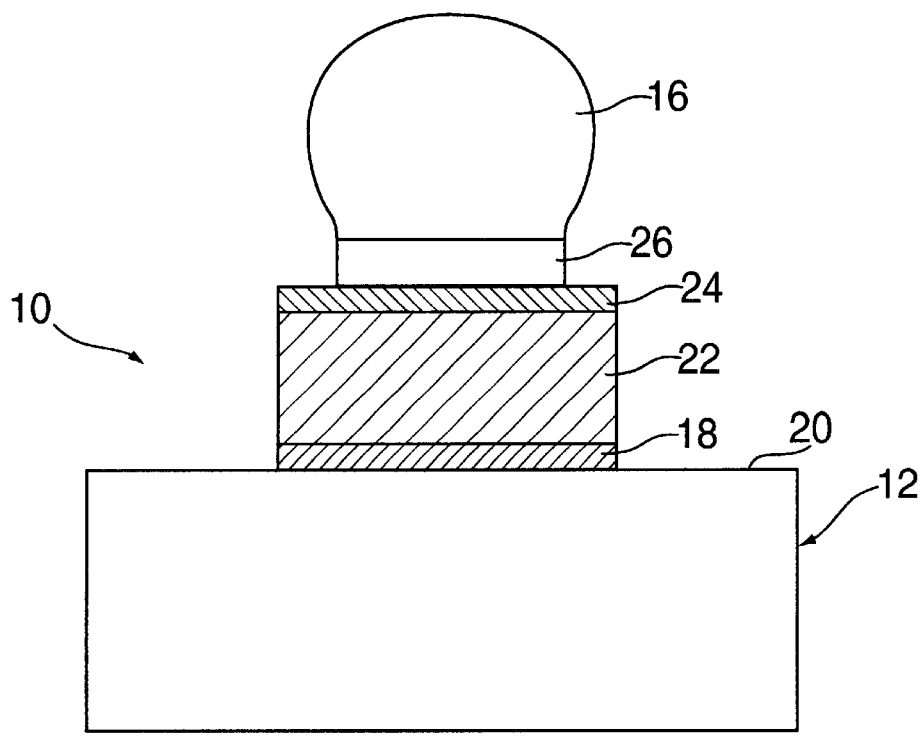
FIG. 1 is a cross-sectional view of an existing electrode structure for a ceramic decoupling capacitor terminated in a C4 solder connection.

Referring initially to FIG. 1, there is shown a cross-sectional view of an existing electrode structure 10 for a ceramic decoupling capacitor 12. Prior to the attachment of the capacitor 12 upon an IC carrier or substrate (not shown), a metallurgical process is used to form the electrode structure 10 having a C4 solder ball termination 16 at an end thereof. Electrode structure 10 includes a first chromium (Cr) layer 18, formed upon the ceramic body 20 of decoupling capacitor 12 by techniques such as by physical vapor deposition, sputtering, evaporation or any other suitable technique. A representative thickness of first chromium layer 18 is about 1,500 Å. The first chromium layer 18 serves as an adhesive layer between ceramic body 20 and a conductive copper (Cu) layer 22 formed atop the first chromium layer 18.

The copper layer 22 is formed to a thickness of about 10,000 Å (1 micron), after which a second chromium layer 24 is deposited thereupon. As is the case with the first chromium layer 18, the second chromium layer 24 has a thickness of about 1,500 Å. The electrode structure 10 is then provided with a ball limiting metallurgy (BLM) 26, which is a pad that limits the flow and spread of the solder ball 16 material upon heating. The presently favored BLM 26 includes, chromium, copper and gold (CrCuAu). Finally, the lead/tin (PbSn) solder C4 connection is applied to the BLM 26 and the capacitor 12 is prepared for attachment to the appropriate location on the substrate.

As mentioned previously, however, when such an electrode structure for decoupling capacitors is used in an unsealed or non-hermetic environment, the exposed sidewalls of copper layer 22 become subject to corrosive effects. Over time, these corrosive effects can weaken the overall electrode structure 10 and degrade the electrical performance of the capacitor 12.

One existing approach to protecting a copper-based electrode structure is to encapsulate the same on an already-mounted decoupling capacitor with a polymeric underfill material. Typically, the underfill material is applied in a two stage process, the first being a liquid or gel stage. Then, the gel is subjected to a hardening stage, such as by curing. While this process allows the copper in the electrode structure to be protected, there are at least two disadvantages with this approach. First, there are additional processing steps involved following the attachment of the decoupling capacitor to the substrate. Second, once the electrode structure is cured, the option of reworking by removing the solder connection is eliminated.

Figure 2:
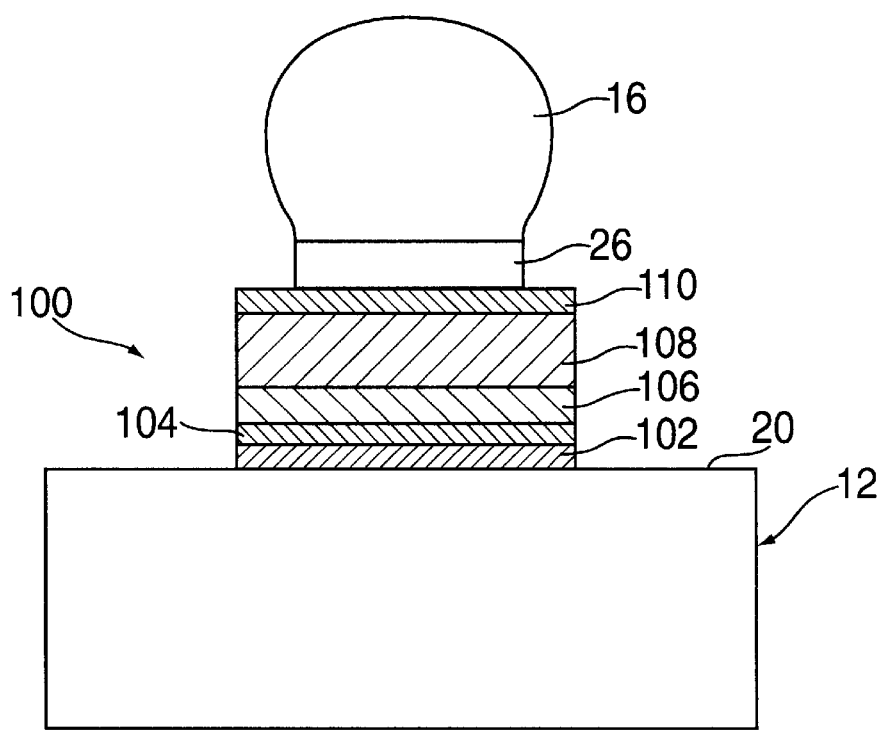
FIG. 2 is a cross-sectional view of a novel electrode structure for a ceramic decoupling capacitor, in accordance with an embodiment of the invention.

Therefore, in accordance with an embodiment of the invention, a novel electrode structure 100 and a method of forming the same is disclosed herein, as shown in FIG. 2. The electrode structure 100 allows for a low-inductance decoupling capacitor to be used in a non-hermetic environment without the need for applying underfill material thereto. For ease of description, like components are designated with like reference numerals.

A first chromium layer 102 is deposited upon the ceramic body 20 of decoupling capacitor 12. The first chromium layer is about 1,500 Å in thickness and serves 102 as an adhesive layer between ceramic body 20 and a first nickel (Ni) layer 104 deposited atop the first chromium layer 102. The first nickel layer 104 has a thickness of about 1,000 Å.

Then, a noble metal conductive layer 106 is deposited atop the first nickel layer 104. In a preferred embodiment, the noble metal conductive layer 106 is gold; however, palladium (Pd) is also a suitable element. The first nickel layer 104 also serves as an adhesive layer since gold (or palladium) does not adhere well to chromium.

The thickness of the deposited noble metal conductive layer 106 is about 2,500 Å. It will be noted that this is approximately four times thinner than the copper layer 22 of the conventional electrode structure 10 in FIG. 1. However, it is found that a 2,500 Å layer of gold provides sufficiently low resistance so as to meet desired circuit performance standards. Used as both an adhesive layer and a protective barrier for subsequent metallurgy, a second nickel layer 108 is formed upon noble metal conductive layer 106. In a preferred embodiment, the second nickel layer 108 is formed to a thickness of at least 5,000 Å, and more preferably to a thickness of about 6,000 Å. In any case, it will be noted that the thickness of the second nickel layer 108 is greater than that of the first nickel layer 104 since second nickel layer 108 also serves as a barrier layer, as will be described in greater detail later.

Finally, the electrode structure 100 is completed with the formation of a second chromium layer 110 atop the second nickel layer 108. Like the first chromium layer 102, the second chromium layer 110 also serves as an adhesion layer. Once the electrode structure 100 is completed, the BLM 26 may then be formed thereupon. Then, the PbSn C4 solder connection 16 is applied to the BLM 26. Not only does the second nickel layer 108 provide adhesion between the noble metal conductive layer 106 and the second chromium layer 110, but it also prevents the interaction of the noble metal material (e.g., gold) with the PbSn solder connection 16.

A comparison of the electrical characteristics of a group of decoupling capacitors fabricated in accordance with the above described invention embodiments was performed with a group of capacitors fabricated in accordance with the existing electrode structure (i.e., copper as the conductive metal) illustrated in FIG. 1. Specifically, measurements of capacitance (in nanofarads) as a function of temperature were taken at a test frequency between 1–3 KHz. The measured values of capacitance for the inventive noble metal decoupling capacitors, taken over a temperature range of about 25° C. to about 85° C., compare favorably to the capacitance values of the existing decoupling capacitors. Generally speaking, the capacitance for both types of decoupling capacitors increases as temperature increases, up to about 55° C. As temperature is further increased above 55° C., however, the capacitance values begin to decrease.

The results were also consistent at a higher test frequency of 40 MHz. Again, the electrical characteristics of the corrosion resistant decoupling capacitors compared favorably with those having the conventional copper electrode structure. Moreover, at ambient temperature (about 25° C.), the corrosion resistant decoupling capacitors were actually found to have a higher capacitance than the conventional decoupling capacitors (e.g., about 145 nF for the corrosion resistant decoupling capacitors as compared to about 125 nF for the conventional decoupling capacitors).

In addition to performing a comparison of electrical characteristics, a corrosion test was designed to examine the behavioral difference between the corrosion resistant decoupling capacitors and the conventional decoupling capacitors. Both types were mounted to modules and subjected to low ppm salting in various solutions of 1% NaCl, 10% NaCl and 3% sea water. The test samples were then placed in a temperature and humidity chamber (at 85° C., 81% relative humidity) for a duration of 2000 hours. Afterward, no electrical degradation was observed as to either type of electrode structure. However, mechanical stress testing of both types of electrode structures revealed a reduced mechanical strength in the metallurgy of the conventional copper electrode structure.

On average, the conventional electrode structure demonstrated about 20% less pull strength at an applied pull strength of 1 pound, whereas the corrosion resistant electrode structure demonstrated 0.99 pound pull strength. More significantly, the mechanical failures after pull testing for the existing decoupling capacitors were located within the CrCuCr electrode structures, whereas the mechanical failures for the inventive CrNiAuNiCr electrode structures were located at the C4 solder connection (also known as a "taffy-pull" failure in the art). Because this mechanical failure mechanism was not demonstrated in the existing electrode structures absent a corrosion test (i.e., without salting), the corrosion in the copper electrode and subsequent mechanical weakening is attributable to the corrosive environment.

Figure 3:
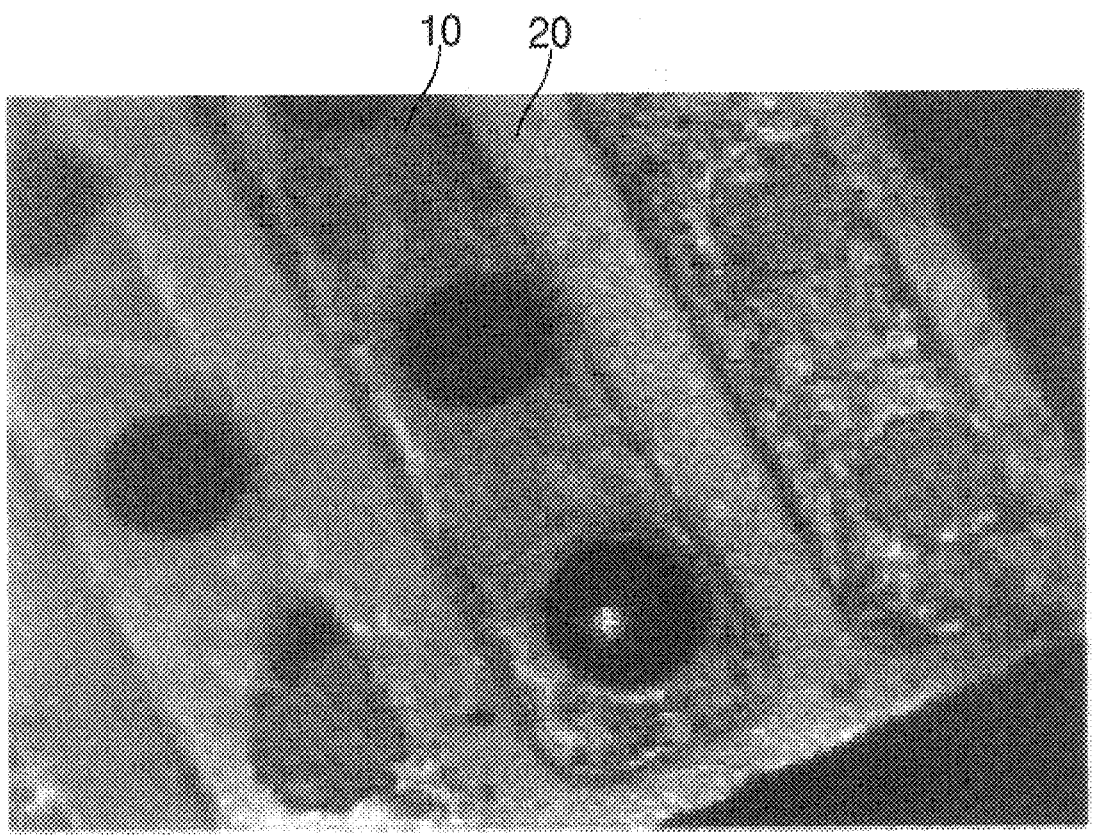
FIG. 3 is an enlarged photograph of a decoupling capacitor having the existing electrode structure of FIG. 1, following salting, temperature & humidity exposure, and a pull test applied thereto.
Figure 4:
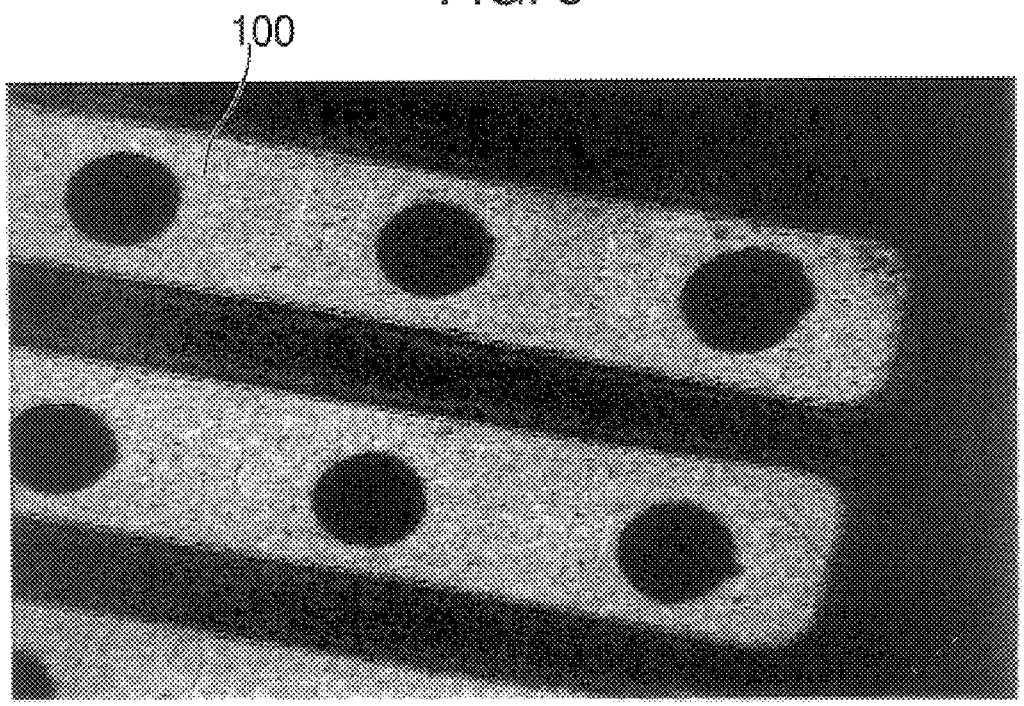
FIG. 4 is an enlarged photograph of a decoupling capacitor having the novel electrode structure of FIG. 2, following salting, temperature & humidity exposure, and a pull test applied thereto.

FIG. 3 is a photograph of one of the corrosion-tested decoupling capacitors having the existing electrode structure 10. As can be seen, the mechanical failures therein are located within the electrode structures (seen as elongated metallic strips in FIG. 3) themselves. In contrast, FIG. 4 is a photograph of one of the corrosion-tested decoupling capacitors having the inventive electrode structure 100. In this case, it is seen that the metallurgy of structure 100 is substantially intact, with the pull failures all occurring at the C4 interconnect.

As disclosed herein, a reliable, low-inductance decoupling capacitor may be used in a non-hermetic environment. Moreover, such a device may be implemented without the need for underfill or other resin materials that would otherwise limit the possibility of reworking (i.e., removing the C4 interconnect and subsequently reattaching).

While the invention has been described with reference to a preferred embodiment, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. An electrode structure for interconnecting a decoupling capacitor to a substrate, comprising:
    a first chromium layer formed upon said capacitor;
    a first nickel layer formed upon said first chromium layer;
    a noble metal conductive layer formed upon said first nickel layer;
    a second nickel layer formed upon said noble metal conductive layer, said second nickel layer having a thickness which is greater than a thickness of said first nickel layer; and
    a second chromium layer formed upon said second nickel layer.

2. The electrode structure of claim 1, wherein said noble metal conductive layer is a gold layer.

3. The electrode structure of claim 2, wherein said first and second chromium layers are about 1,500 Å in thickness.

4. The electrode structure of claim 2, wherein said gold layer is about 2,500 Å in thickness.

5. The electrode structure of claim 2, wherein said first nickel layer is about 1,000 Å in thickness, and said second nickel layer is at least 5,000 Å in thickness.

6. The electrode structure of claim 5, wherein said second nickel layer is about 6,000 Å in thickness.

7. A decoupling capacitor for interconnection to an integrated circuit device, comprising:
    a ceramic body;
    an electrode structure mounted to said ceramic body, said electrode structure further comprising,
        a first chromium layer formed upon said ceramic body;
        a first nickel layer formed upon said first chromium layer;
        a noble metal conductive layer formed upon said first nickel layer;
        a second nickel layer formed upon said noble metal conductive layer, said second nickel layer having a thickness which is greater than a thickness of said first nickel layer; and
        a second chromium layer formed upon said second nickel layer;
    a solder interconnect; and
    a ball limiting metallurgy (BLM), disposed between said solder interconnect and said electrode structure, said BLM preventing the spread of said solder interconnect into said noble metal conductive layer.

8. The decoupling capacitor of claim 7, wherein said noble metal conductive layer is a gold layer.

9. The decoupling capacitor of claim 8, wherein said first and second chromium layers are about 1,500 Å in thickness.

10. The decoupling capacitor of claim 8, wherein said gold layer is about 2,500 Å in thickness.

11. The decoupling capacitor of claim 8, wherein said first nickel layer is about 1,000 Å in thickness, and said second nickel layer is at least 5,000 Å in thickness.

12. The decoupling capacitor of claim 11, wherein said second nickel layer is about 6,000 Å in thickness.

* * * * *